(12) United States Patent
Chin et al.

(10) Patent No.: US 6,541,366 B1
(45) Date of Patent: Apr. 1, 2003

(54) METHOD FOR IMPROVING A SOLDER BUMP ADHESION BOND TO A UBM CONTACT LAYER

(75) Inventors: Shih-Ming Chin, Miaoli (TW); Fang-Chuang Liu, Hsinchu (TW); Chia-Jen Cheng, Taoyuan (TW); Hsiu-Mei Yu, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/043,058

(22) Filed: Jan. 8, 2002

(51) Int. Cl.[7] .................... H01L 21/44; H01L 23/48
(52) U.S. Cl. .................. 438/613; 438/108; 438/612; 257/779
(58) Field of Search .................. 438/108–109, 438/107–127, 754, 745–747, 612–614, 613; 257/735–758, 750, 751, 762, 766, 778–781, 779; 216/2, 13, 16

(56) References Cited

U.S. PATENT DOCUMENTS 5,937,320 A  *  8/1999  Andricacos et al.

2001/0032986 A1  *  10/2001  Miyasaka
2001/0051396 A1  *  12/2001  Iwahashi et al.

* cited by examiner

*Primary Examiner*—Long Pham
*Assistant Examiner*—Dilinh Nguyen
(74) *Attorney, Agent, or Firm*—Tung & Associates

(57) ABSTRACT

A method for improving an adhesion bond between a solder material and an under bump metallization (UBM) layer including providing at least two UBM layers overlying a chip bonding pad including an uppermost UBM layer forming a contact layer for forming a solder bump thereon; depositing a solder bump precursor material overlying the contact layer to form a solder column; exposing the sidewalls of the solder column to include the contact layer sidewalls; oxidizing the contact layer sidewalls to form a contact layer sidewall oxide at a temperature lower than the melting point of the solder bump precursor material; and forming a solder bump by reflowing the precursor material to wet the contact layer surface to exclude the contact layer sidewalls.

20 Claims, 2 Drawing Sheets

METHOD FOR IMPROVING A SOLDER BUMP ADHESION BOND TO A UBM CONTACT LAYER

FIELD OF THE INVENTION

This invention generally relates to flip chip bonding technology and more particularly to improving a solder bump adhesion bond to a UBM contact layer.

BACKGROUND OF THE INVENTION

Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

As semiconductor device sizes have decreased, the density of devices on a chip has increased along with the size of the chip thereby making chip bonding more challenging. One of the major problems leading to package failure as chip sizes increase is the increasingly difficult problem of thermal coefficient of expansion (TCE) mismatches between materials leading to stress buildup and consequent failure. For example, in flip chip technology chip bonding is accomplished by means of solder bumps formed on under bump metallization (UBM) layers overlying a chip bonding pad where, frequently, improper wetting (bonding) between the solder and UBM layers may lead to a bond not sufficiently strong to withstand such stresses.

In many cases it is necessary to repackage the chip after a package failure requiring costly detachment of the chip from the package and repeating the chip bonding process in a new package. Some chip bonding technologies utilize a solder bump attached to a contact pad (chip bonding pad) on the chip to make an electrical connection from the chip devices to the package. For example, C4 (Controlled-Collapse Chip Connection) is a means of connecting semiconductor chips to substrates in electronic packages. C4 is a flip-chip technology in which the interconnections are small solder balls (bumps) on the chip surface. Since the solder balls forms an area array, C4 technology can achieve the highest density scheme known in the art for chip interconnections. The flip chip method has the advantage of achieving the highest density of interconnection to the device with the lowest parasitic inductance.

Solder bumps may be formed by, for example, vapor deposition of solder material over layers of under bump metallization (UBM) formed on the chip bonding pad. In another method, the layers of solder material may deposited by electrodeposition onto a seed layer material deposited over UBM layers formed on the chip bonding pad. In yet another method, solder bumps may be formed by a solder-paste screen printing method using a mask (stencil) to guide the placement of the solder-paste. Typically, after deposition of the solder materials, for example, in layers or as a homogeneous mixture, the solder bump (ball) is formed after removing a photoresist mask defining the solder material location by heating the solder material to a melting point where according to a reflow process a solder ball is formed with the aid of surface tension. Alternatively, a solder bump (column) may be formed within a permanent mask made of photoresist or some other organic resinous material defining the solder bump area over the chip bonding pad.

In an exemplary process for forming a solder bump on a semiconductor chip, reference is made to FIGS. 1A–1E representational of a cross sections of an exemplary chip bonding pad an associated UBM layers and solder bump for chip bonding in flip chip technology. For example, with reference to FIG. 1A, the process of creating the solder bumps begins after chip bonding pad 10, for example Cu or Al, formed by vapor deposition has been deposited on the surface of the semiconductor wafer 8. After the chip bonding pad 10 is formed, a passivation layer 12 of, for example, silicon dioxide ($SiO_2$) is formed over the semiconductor device surface excluding a portion overlying the chip bonding pad 10. Typically, one or more under bump metallization (UBM) layers, e.g., 14A of from about 500 Angstroms to about 5000 Angstroms are then deposited over chip bonding pad 10 and a layer of photoresist 16 formed thereover as shown in FIG. 1B. The UBM layer 14A may be, for example, a layer of titanium. The photoresist layer is typically from about 10 to about 25 microns high. As shown in FIG. 1B, the photoresist layer 16 is photolithographically patterned and developed to form an opening 17 above the contact pad 10 to expose the UBM layer, e.g., 14A. Additional UBM layers may be formed within the mask opening 17 by, for example, an electroplating process or vapor deposition process forming e.g., UBM layers 14B and 14C in FIG. 1C. Layers 14B and 14C may be for example, layers of copper and nickel, respectively. UBM layers are formed over the chip bonding pad 10, for example, to allow for better bonding and wetting of the solder material to the uppermost UBM layer adjacent the solder material, e.g., 14C, and for protection of the chip bonding pad 10 by the lowermost UBM layer, e.g., 14A. A column of solder material 18A may either be deposited in layers, for example, a layer of Pb followed by a layer of Sn, the solder material layers later being formed into a homogeneous solder during reflow, or may be deposited as a homogeneous solder material by for example vapor deposition or electroplating onto a seed layer (e.g., 14C). After removal of the photoresist layer 16, the UBM layer 14A is etched through by a reactive ion etch (RIE) process to the underlying passivation layer 12 using the solder column 18A as an etching mask to protect the underlying UBM layers 14A, 14B, and 14C, as shown in FIG. 1D. The solder column 18 is then heated to reflow to form a solder bump 18B over the UBM layer 14C as shown in FIG. 1E. After reflow, a homogeneous Pb/Sn solder bump is formed including, for example, with composition ratios indicating weight percent, high lead alloys including 95 Pb/5 Sn (95/5) or 90 Pb/10 Sn (95/10) with melting temperatures in excess of 300° C. or eutectic 63 Pb/37 Sn (63/37) with a melting temperature of 183° C. The solder bump forms a homogeneous material and has a well defined melting temperature. For example, the high melting Pb/Sn alloys are reliable bump metallurgies which are particularly resistant to material fatigue.

A series of layers may be advantageously used to form the UBM layers. The uppermost UBM layer adjacent the solder bump supplies a wettable layer during reflow for the solder bump subsequently formed thereover. For example, some UBM systems to form the plurality of UBM layers may include, reciting the lowermost layer adjacent the chip bonding pad first, chromium and copper (Cr/Cu), titanium and copper (Ti/Cu), and titanium-tungsten (Ti:W/Cu) and copper (Ti:W/Cu), and titanium, copper, nickel (Ti/Cu/Ni). Since conventional bumps melt completely in the reflow soldering process of the flip-chip bonding technique intimately contacting the UBM, the UBM must be able to withstand thermal and mechanical stresses and resist intermetallic phase formations. In conventional solder bumps, the quality of the UBM layers and wettability during reflow is critical to the reliability of the complete assembly. The UBM layers define the size of the solder bump after reflow, provide a surface that is wettable by the solder and that reacts with the solder to provide an adhesion bond preferably with mechanical integrity and thereby acceptable reliability under mechanical and heat stresses. Further, the UBM layers act as a barrier between the semiconductor device and the metals in the interconnection.

One recurring problem with forming a solder bump relates to the wetting behavior of the solder and the UBM layers. For example, preferably, only the major surface of the UBM metal layer adjacent the solder (contact layer) is wetted by the solder during the reflow process and the solder bump is confined to the major surface. In theory, surface tension effects will cause the solder to ball-up during the reflow process to form a ball confined to the uppermost UBM layer surface. In practice, however, it has been found that the mechanical integrity of the solder bump-UBM joint as well as the mechanical integrity of the underlying UBM layers can be compromised by the phenomenon of solder spill-over where the reflowing solder wets the sidewalls of the UBM layers. As a result, UBM layers underlying the wettable UBM layer, for example copper, may be weakened by corrosive solder interaction as well as weakening the bond with the UBM contact layer.

There is therefore a need in the semiconductor processing art to develop a solder bump formation process whereby reliable wetting by the solder of the UBM contact layer is ensured thereby providing a reliable solder connection.

It is therefore an object of the invention to provide a method for solder bump formation whereby reliable wetting by the solder of the UBM contact layer is ensured thereby providing a reliable solder connection while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for improving an adhesion bond between a solder material and an under bump metallization (UBM) layer.

In a first embodiment of the present invention, the method includes the steps of providing at least two UBM layers overlying a chip bonding pad including an uppermost UBM layer forming a contact layer for forming a solder bump thereon; depositing a solder bump precursor material overlying the contact layer to form a solder column; exposing the sidewalls of the solder column to include the contact layer sidewalls; oxidizing the contact layer sidewalls to form a contact layer sidewall oxide at a temperature lower than the melting point of the solder bump material; and, forming a solder bump by reflowing the solder to wet the contact layer surface to exclude the contact layer sidewalls.

In a related embodiment, the at least two UBM layers include three UBM layers. Further, the three UBM layers include a titanium layer, a copper layer, and a nickel layer sequentially ordered with the titanium layer adjacent the chip bonding pad and the nickel layer forming the contact layer. In a related embodiment the contact layer comprises nickel.

In another embodiment, the step of depositing a solder bump precursor material further comprises using a mask aligned over the chip bonding pads to define deposition of the solder bump precursor material.

In yet another embodiment, the step of oxidizing the contact layer sidewalls further comprises exposing the contact layer sidewalls to an oxygen containing plasma. Further, the oxygen containing plasma is formed under plasma reactor operating conditions including microwave power supplied from about 1200 Watts to about 1600 Watts, an oxygen flow rate of from about 1200 sccm to about 3000 sccm, and a total pressure of from about 350 mTorr to about 600 mTorr. Further yet, the contact layer sidewalls are exposed to the oxygen containing plasma for a period of from about 1 to about 3 minutes. Yet Further, the contact layer sidewalls are exposed to the oxygen containing plasma for a period of time sufficient to form the contact layer sidewall oxide with a thickness of from about 50 Angstroms to about 200 Angstroms.

In another embodiment, the contact layer sidewall oxide is formed with a thickness of from about 50 Angstroms to about 200 Angstroms.

In a related embodiment the step of oxidizing the contact layer sidewalls is performed following reactive ion etching to expose a passivation layer overlying the chip bonding pad.

These and other embodiments, aspects and features of invention will be better understood from a detailed description of the preferred embodiments of the invention which further described below in conjunction with the accompanying Figures.

DETAILED DESCRIPTION OF THE PREFERRED EMBODIMENTS

Figure 1A:
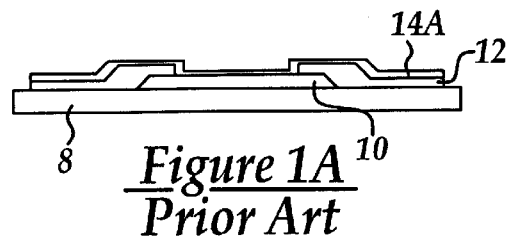
FIGS. 1A–1E are cross-sectional side view representations of an exemplary process according to the prior art or forming a solder bump over a chip bonding pad at stages in a manufacturing process.
Figure 1B:
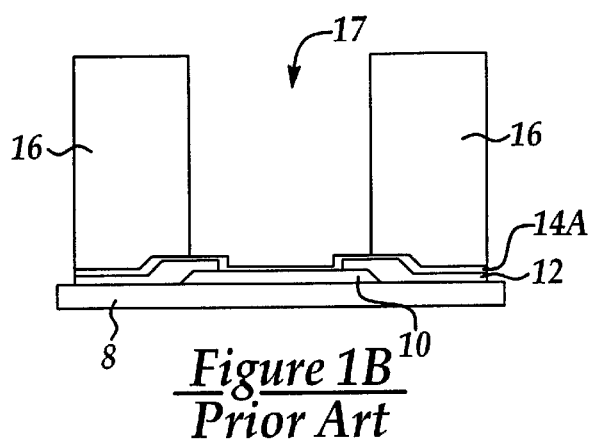
Figure 1C:
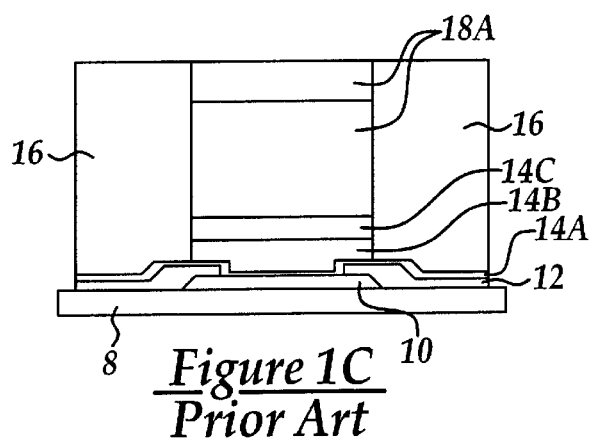
Figure 1D:
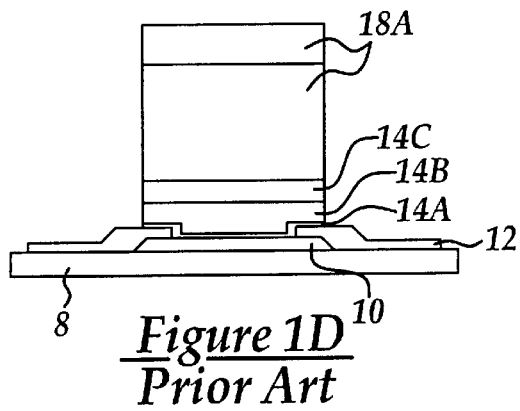
Figure 1E:
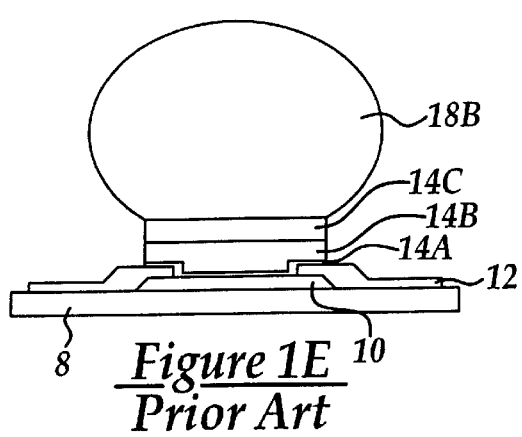
Figure 2A:
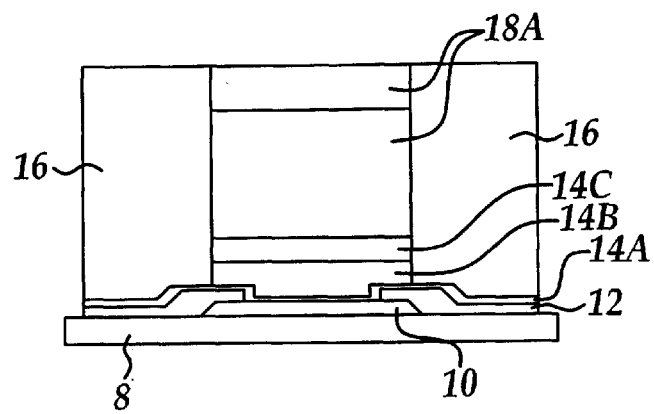
FIGS. 2A–2C are cross-sectional side view representations of an exemplary process according to the present invention for forming a solder bump over a chip bonding pad at selected stages in a manufacturing process.

The method and apparatus according to the present invention is more clearly described by referring to FIG. 2A which is representative cross-sectional side view representation of a stage in a manufacturing process for creating a solder bump bonded to a UBM layer overlying a chip bonding pad according to the present invention. Shown in FIG. 2A, is semiconductor chip 8 with chip bonding pad 10 formed thereover, followed by passivation layer 12 partially covering bonding pad 10 to leave an opening where UBM layer 14A, for example, titanium, is adjacently overlying chip bonding pad 10. UBM layer 14B, for example Copper (Cu), immediately overlies titanium layer 14A followed by a UBM contact layer 14C, for example nickel. Photoresist layer 16 is deposited and developed to form a mask for deposition of UBM layers 14B and 14C over the UBM layer 14A. In addition, solder bump precursor material 18A, is deposited over UBM contact layer 14C either as a homogeneous solder precursor material or as precursor material comprising for example, layers of Pb and Sn later homogenized by a reflow process. The UBM layers 14A, 14B, and 14C and solder precursor material 18A may be deposited by vapor deposition, or may be electrodeposited unto a suitable seed layer by methods well known in the art.

Figure 2B:
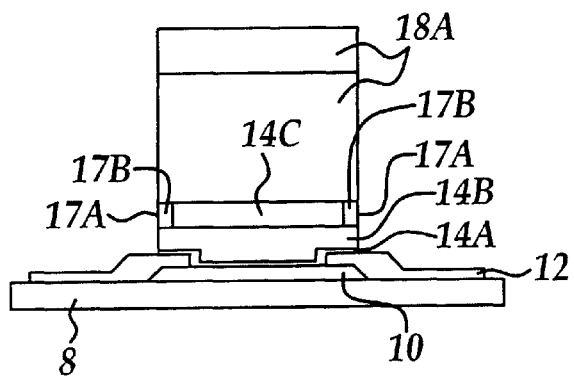

As shown in FIG. 2B, after removal of the photoresist layer 16, the UBM contact layer 14C sidewalls, e.g., 17A are exposed. According to the present invention, the sidewalls e.g., 17A of the UBM contact layer 14C are oxidized following etching of the UBM layer(s), for example 14A, extending outside the diameter the solder column 18A, to expose the passivation layer 12. During etching by, for example, a reactive ion etch (RIE) prior to reflowing the solder column 18A, the solder column 18A acts as an etching mask to protect UBM layers underlying the solder column 18A.

According to the method of the present invention, following etching of the UBM layer, e.g., 14A, but prior to reflow, the exposed sidewalls of the UBM layers including UBM contact layer 14C sidewalls, e.g., 17A are subjected to an oxidation treatment. Exemplary conditions for the oxidation treatment include conditions for an oxygen plasma treatment carried out in a plasma reactor with, for example, including from about 1200 to about 1600 Watts of microwave power supplied to the plasma, more preferably about 1500 Watts, an oxygen ($O_2$) flow rate of about 1200 to 3000 sccm and a total plasma reactor pressure of about 350 to 600 mTorr. It will be appreciated that any plasma reactor may be used according to the present invention including a PECVD type reactor, an HDP-CVD reactor, a dual RF power source plasma reactor or other plasma reactor able to sustain a plasma of oxygen.

According to the present invention, using an oxygen plasma to carry out the oxidation of the UBM contact layer 14C sidewalls e.g., 17A has the advantage that oxidation may be quickly carried out at temperatures lower than the solder reflow temperature. For example, according to the present invention, an oxide layer 17B, for example, a layer of nickel oxide (NiO) of from about 50 Angstroms to about 200 Angstroms is formed over the UBM contact layer 14C sidewalls, e.g., 17A within a period of from about 2 to 3 minutes under exposure to the oxygen plasma.

Figure 2C:
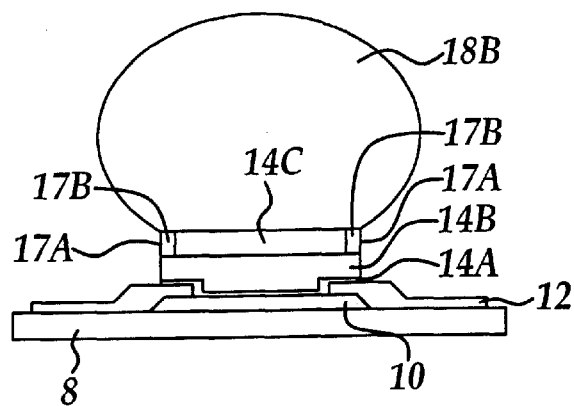

According to the present invention, uppermost UBM layer 14C (UBM contact layer), for example nickel, with exposed sidewalls e.g., 17A are treated to form an oxide layer 17B, thereby changing the surface tension characteristics of the UBM contact layer 14C and making the sidewalls e.g., 17A unwettable by the reflowing solder. As a result, as shown in FIG. 2C, during reflowing (melting) of the solder precursor material 18A, a homogeneous solder ball 18B is formed with the solder ball 18B and resulting adhesion bond confined to the major surface of the UBM contact layer 14C.

After reflow, a homogeneous Pb/Sn solder is formed including, for example, with composition ratios indicating weight percent, high lead alloys including 95 Pb/5 Sn (95/5) or 90 Pb/10 Sn (95/10) with melting temperatures in excess of 300° C. or eutectic 63 Pb/37 Sn (63/37) with a melting temperature of 183° C.

Although the present invention has been explained with reference to a plasma reactor, it will be appreciated that other oxidation processes may be used to form an oxidation layer on the sidewalls of the UBM contact layer to alter its surface tension characteristics and therefore its wettability. For example, oxidation at temperatures lower than the solder reflow temperature may be used to create the oxide layer on the UB3M contact layer sidewalls.

The preferred embodiments, aspects, and features of the invention having been described, it will be apparent to those skilled in the art that numerous variations, modifications, and substitutions may be made without departing from the spirit of invention as disclosed and further claimed below.

What is claimed is:

1. A method for improving an adhesion bond between a solder material and an under bump metallization (UBM) layer comprising the steps of:
   providing at least two UBM layers overlying a chip bonding pad including an uppermost UBM layer forming a contact layer for forming a solder bump thereon;
   depositing a solder bump precursor material overlying the contact layer to form a solder column;
   exposing the sidewalls of the solder column to include the contact layer sidewalls;
   oxidizing the contact layer sidewalls to form a contact layer sidewall oxide at a temperature lower than the melting point of the solder bump precursor material to make the contact layer sidewalls unwettable in a subsequent reflow process; and,
   forming a solder bump by reflowing the precursor material to wet the contact layer surface to exclude the contact layer sidewalls.

2. The method of claim 1, wherein the at least two UBM layers include three UBM layers.

3. The method of claim 2, wherein the three UBM layers include a titanium layer, a copper layer, and a nickel layer are sequentially ordered with the titanium layer adjacent the chip bonding pad and the nickel layer forming the contact layer.

4. The method of claim 1, wherein the contact layer comprises nickel.

5. The method of claim 1, wherein the step of depositing a solder bump precursor material further comprises using a mask aligned over the chip bonding pads to define deposition of the solder bump precursor material.

6. The method of claim 1, wherein the step of oxidizing the contact layer sidewalls further comprises exposing the contact layer sidewalls to an oxygen containing plasma.

7. The method of claim 6, wherein the oxygen containing plasma is formed under plasma reactor operating conditions including microwave power supplied from about 1200 Watts to about 1600 Watts, an oxygen flow rate of from about 1200 sccm to about 3000 sccm, and a total pressure of from about 350 mTorr to about 600 mTorr.

8. The method of claim 7, wherein the contact layer sidewalls are exposed to the oxygen containing plasma for a period of from about 1 to about 3 minutes.

9. The method of claim 6, wherein the contact layer sidewalls are exposed to the oxygen containing plasma for a period of time sufficient to form the contact layer sidewall oxide with a thickness of from about 50 Angstroms to about 200 Angstroms.

10. The method of claim 9, wherein the oxide comprises nickel oxide.

11. The method of claim 1, wherein the contact layer sidewall oxide is formed with a thickness of from about 50 Angstroms to about 200 Angstroms.

12. The method of claim 1, wherein the step of oxidizing the contact layer sidewalls is performed following reactive ion etching to expose a passivation layer overlying the chip bonding pad.

13. A method for confining solder in a reflow process to the major surface of an under bump metallization (UBM) contact layer in a flip chip bonding process comprising the steps of:
   providing a plurality of UBM layers overlying a chip bonding pad including a UBM contact layer for forming a solder bump on the major surface thereon;
   depositing a solder bump precursor material overlying the UBM contact layer to form a solder column;

exposing the UBM contact layer sidewalls;

oxidizing the UBM contact layer sidewalls by exposing the contact layer sidewalls to one of an oxygen containing plasma and a steam oxidation process to form a UBM contact layer sidewall oxide thereover at a temperature lower than the melting point of the solder bump precursor material to make the contact layer sidewalls unwettable by the solder bump precursor material in a subsequent reflow process; and, forming a solder bump by reflowing the solder bump precursor material said solder bump remaining confined to the major surface of the UBM contact layer.

14. The method of claim 13, wherein the UBM contact layer comprises nickel.

15. The method of claim 13, wherein the UBM contact layer has at least one underlying UBM layer.

16. The method of claim 15, wherein the at least one underlying UBM layer includes a copper layer underlying the UBM contact layer said UBM contact layer comprising nickel, and a titanium layer underlying the copper layer.

17. The method of claim 13, wherein the oxygen containing plasma is formed under plasma reactor operating conditions including microwave power supplied from about 1200 Watts to about 1600 Watts, an oxygen flow rate of from about 1200 sccm to about 3000 sccm, and a total pressure of from about 350 mTorr to about 600 mTorr.

18. The method of claim 17, wherein the UBM contact layer sidewalls are exposed to the oxygen containing plasma for a period of from about 1 to about 3 minutes.

19. The method of claims 13, wherein the UBM contact layer sidewalls are exposed to the oxygen containing plasma for a period of time sufficient to form the UBM contact layer sidewall oxide with a thickness of from about 50 Angstroms to about 200 Angstroms.

20. The method of claim 19, wherein the oxide comprises nickel oxide.

* * * * *